United States Patent [19]
Griesbaum

[11] Patent Number: 5,742,357
[45] Date of Patent: Apr. 21, 1998

[54] DIRECT DATA TUNER

[75] Inventor: Peter Griesbaum, Phoenix, Ariz.

[73] Assignee: Wavephore, Inc., Phoenix, Ariz.

[21] Appl. No.: 631,266

[22] Filed: Apr. 12, 1996

[51] Int. Cl.$^6$ .................................................. H04N 5/50
[52] U.S. Cl. .................. 348/731; 348/726; 348/473
[58] Field of Search .................. 348/731, 726, 348/727, 607, 618, 737, 473, 486, 487; 455/182.3, 180.3, 183.2, 192.2, 192.3, 197.1; 331/11, 16; H04N 5/50

[56] References Cited

U.S. PATENT DOCUMENTS

| | | | |
|---|---|---|---|
| 5,311,318 | 5/1994 | Dobrovolny | 348/731 |
| 5,327,237 | 7/1994 | Gerdes et al. | 348/476 |
| 5,387,941 | 2/1995 | Montgomery et al. | 348/473 |
| 5,410,360 | 4/1995 | Montgomery et al. | 348/473 |
| 5,572,264 | 11/1996 | Mizukami et al. | 348/735 |
| 5,621,471 | 4/1997 | Kim et al. | 348/473 |

*Primary Examiner*—Glenton B. Burgess
*Attorney, Agent, or Firm*—Snell & Wilmer, L.L.P.

[57] ABSTRACT

An improved tuner for recovery of data having a data bandwidth embedded in a video signal transmitted in association with a video carrier frequency is disclosed. The entire video signal is shifted to the intermediate frequency bandwidth, thereby shifting the data bandwidth to an IF data bandwidth. The IF data bandwidth is then filtered to block as much of the spectrum of the IF signal that is outside of the IF data bandwidth. The filtered IF data bandwidth is then demodulated again using an IF carrier generated by a local oscillator that tracks frequency drift in the carrier.

12 Claims, 3 Drawing Sheets

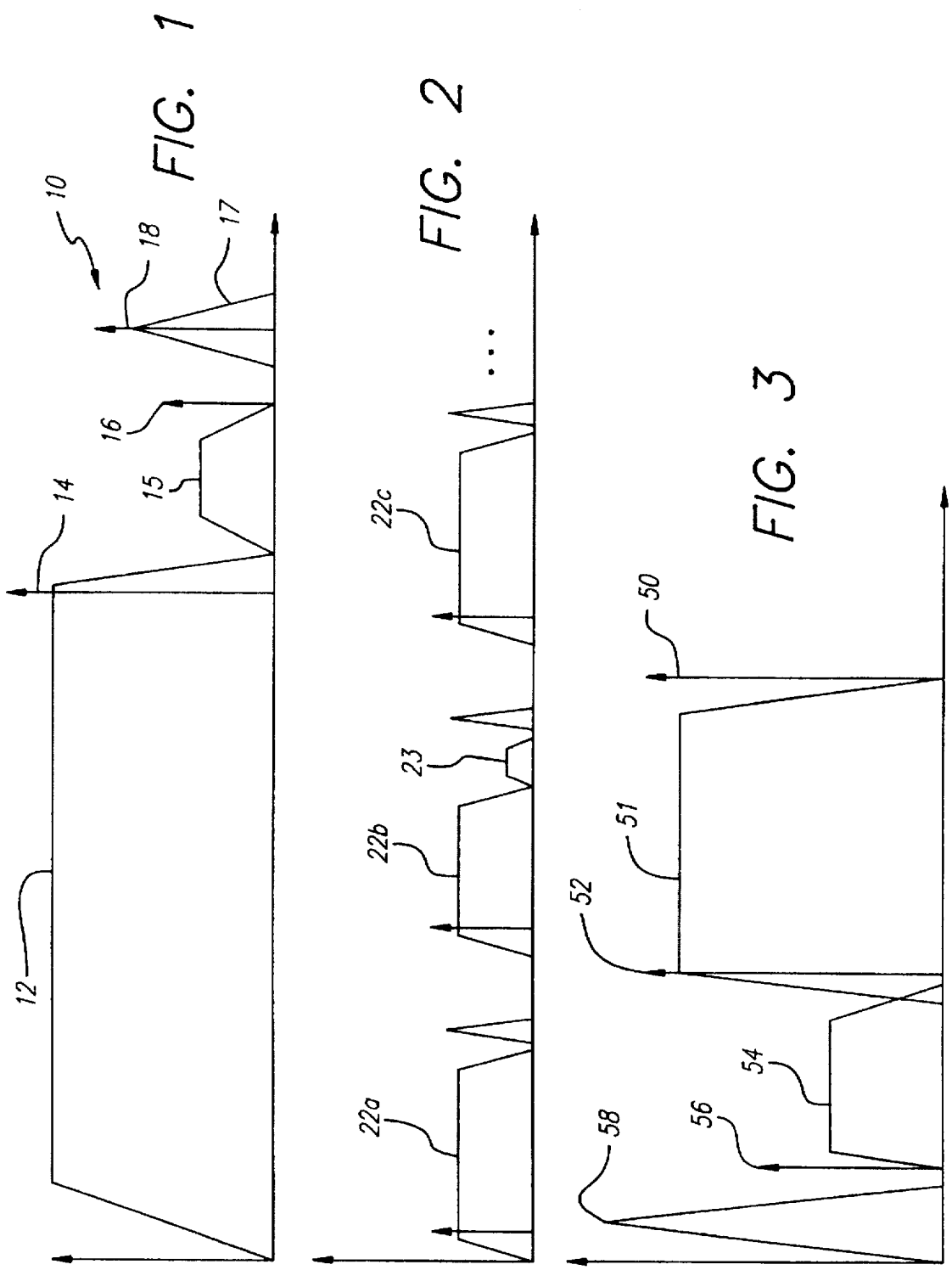

5,742,357

DIRECT DATA TUNER

BACKGROUND OF THE INVENTION

1. Field of the Invention

This invention relates to tuners and more particularly to tuners designed for extracting data from video signals.

2. Description of the Prior Art

It has been known for a substantial period of time that the video bandwidth is inefficiently used. A variety of mechanisms have evolved for injecting data into the video signal. These include, for example, closed captioned television and tele text, which are transmitted during the blanking intervals. Also, other uses of the video spectrum include HDTV and EDTV.

Other methods have evolved which include transmitting information during the blanking interval. These methods include those developed by WavePhore, Inc., the assignee of this patent application and include those set forth in U.S. Pat. Nos. 5,327,237, 5,387,941, and 5,410,360, and in WavePhore, Inc.'s Response to a Request for Proposals submitted to the National Data Broadcasting Committee dated Apr. 26, 1994. In at least some of these systems developed by WavePhore, a digital signal is rasterized at the same rate as the vertical and horizontal blanking intervals of the primary video signal and is bandwidth limited. The primary baseband video signal (minus the audio signal), which may be an NTSC, SECAM or PAL signal for example, is also filtered by a bandstop filter, which blocks all of the primary video signal above the color subcarrier to create a video baseband data bandwidth. Thus, for example, with NTSC video, a brickwall lowpass filter having an upper frequency limit slightly above the 3.59 MHz color subcarrier is used. The data is modulated such as for lower single sideband modulation with a data subcarrier located at about the edge of the color bandwidth, which for an NTSC signal may be 4.197 MHz. Alternatively, the data can be injected with a subcarrier at another frequency such as at in the middle of the data bandwidth for QAM or QPSK. Thus, the data is injected into the video signal, residing in the data bandwidth, within the video base band created by the bandstop filter between about 3.6 MHz and 4.2 MHz for an NTSC signal. If frequency interleaving is desired, the data may be modulated with a data subcarrier at an odd quarter multiple (i.e., N/4 where N is an odd number) of the horizontal scanning rate.

To create the combined video data signal, the rasterized, modulated data signal is then injected into the video signal at a low level of injection, typically 45 dB or more down. Further, the timing of the modulated, data signal is also controlled so that sufficient guard periods and timing synch signals are injected into the data stream to avoid data transmission during the blanking intervals. Some of these techniques are described in U.S. Pat. No. 5,327,237, U.S. Pat. No. 5,387,941, U.S. Pat. No. 5,410,360 and U.S. patent application Ser. No. 08/075,188, filed on Jun. 14, 1993 and are incorporated herein by reference. Various sequences may be injected into the data stream for providing synch instead of recovering synch from horizontal.

However, due to the low level of injection, recovery of the data signal can be difficult. Any significant noise including the adjacent channel signal can mask the data information. Also frequency drift in the video IF carrier or transmitter carrier used for transmitting the combined data video signal may raise the noise floor, making data recovery more difficult. Therefore, it is a first object to improve data recovery techniques. While recovery of the data in noisy environments has often involved specialized designs such as disclosed in the assignee's application, U.S. patent application Ser. No. 08/249,017 filed on May 25, 1994, these require specially designed circuits. Therefore it is a second object of this invention to improve data recovery techniques by using conventional video circuits where possible.

SUMMARY OF THE INVENTION

These and other objects of the invention are attained by special filtering in the intermediate frequency (IF) portion in the tuner limited along with an IF L.O. frequency that tracks the video carrier drift. A conventional video tuner selects the appropriate channel and provides a full video signal at IF. However, the gain of the tuner is set deliberately higher than is conventional to boost signal strength. The IF video signal, which includes both the video and the data bandwidth signal, is filtered by an IF data bandwidth bandpass filter and then amplified and filtered again to provide essentially only the data bandwidth in the IF signal. The IF data bandwidth is then provided to a mixer that mixes the data IF with an IF carrier generated by the L.O. that tracks frequency drift in the video carrier.

The full video signal at IF is also provided through an amplifier and video SAW to a video demodulator that generates a signal that tracks one half the drift of the tracking transmitter carrier frequency at one half of the IF. The drift tracking signal is amplified and frequency doubled to provide a local oscillator/drift tracker IF signal for further demodulation. That demodulation is then low pass filtered, the sound is eliminated with a sound trap and the output is provided for decoding such as in any of U.S. Pat. Nos. 5,327,237; 5,387,941; and 5,410,360.

DESCRIPTION OF THE FIGURES

FIG. 1 is a chart showing the combined video and data spectrum at baseband.

FIG. 2 is a chart showing the spectra of three adjacent video channels.

FIG. 3 is a chart showing the spectra of a lower side band of a video channel at IF.

DETAILED DESCRIPTION OF THE INVENTION

Figure 4:
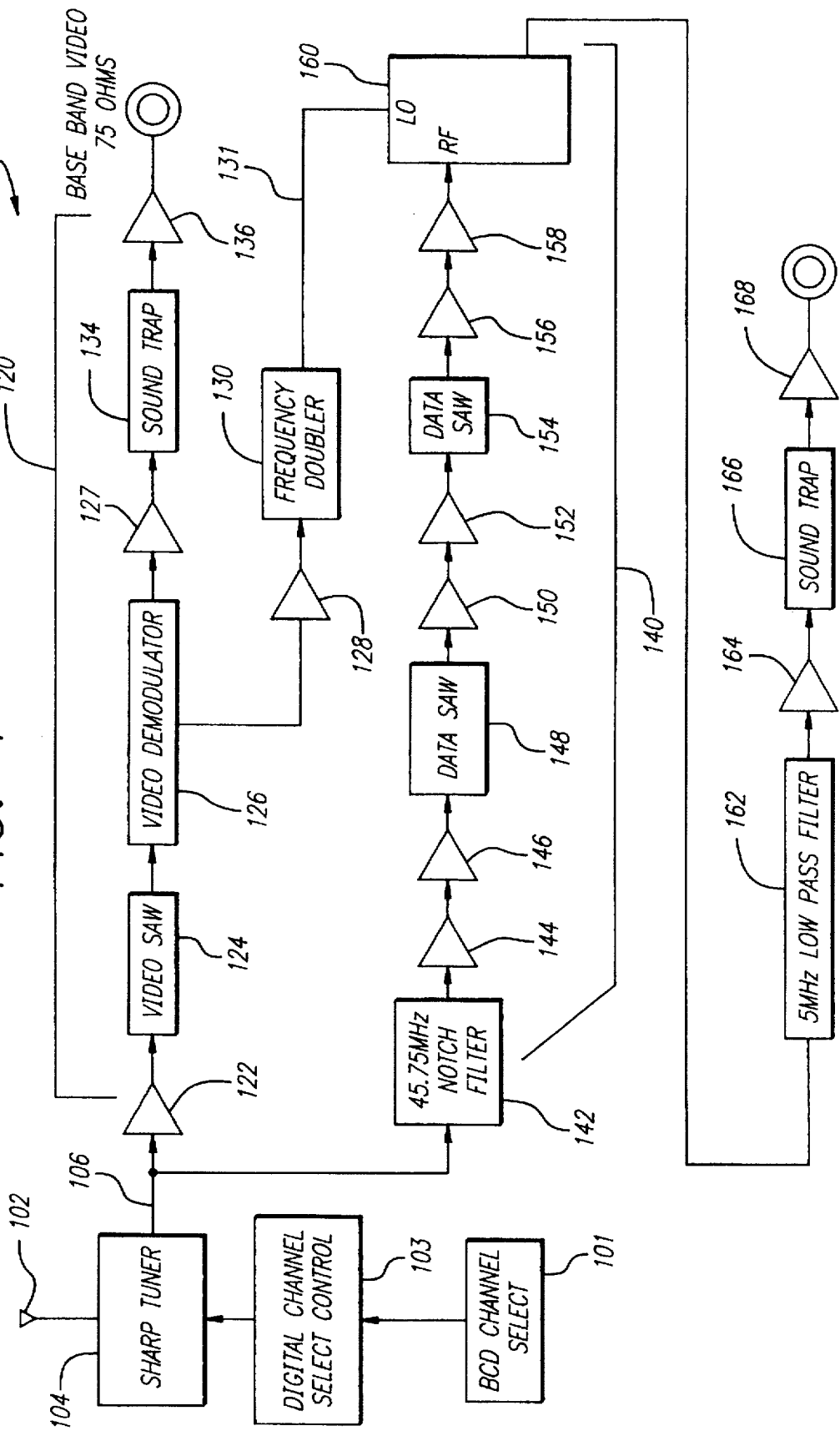
FIG. 4 is a block diagram of an embodiment of a tuner according to the present invention.

FIG. 1 shows the baseband amplitude spectra 10 of a combined video signal including a primary color video signal and the secondary data signal. For an NTSC color video signal, the signal includes baseband lumina and chromina spectra envelope 12 from about 0 hertz to just above the frequency of the color subcarrier 14 at 3.59 MHz. The baseband data signal envelope 15 starts with the rolloff of the lumina and chromina envelope 12 and extends up to what would normally be the upper edge of the video baseband signal, i.e. about 4.1 MHz for NTSC video. If the data has been modulated using single sideband amplitude modulation, the data subcarrier 16 is preferably located at about that upper limit such as at 4.197 MHz. Alternatively, the data may be modulated using QPSK or QAM with a central data baseband subcarrier. The data is also injected at a much lower level (typically about 45 to 50 dB down) to avoid discernable interference in ordinary television receivers. Finally, after a narrow guard band, the envelope 17 for the audio portion of the signal can be found with the audio sub carrier 18 for an NTSC signal being located at 4.5 MHz.

FIG. 2 shows a plurality of the spectra envelopes of adjacent channels 22a, 22b, 22c . . . 22n with one of the channels 22(b) including a data spectra 23 within the envelope 22b such as may be found in a cable television system. As can be seen from FIG. 2, it is possible that with intermodulation nearby channels may cause noise problems with data recovery. With the data portion of the transmitted bandwidth over 45 dB lower than the peak of the video bandwidth, even with a highly selective tuner, interference from adjacent channels can be a problem with recovery due to adjacent channel intermodulation.

As shown in the embodiment 100 in FIG. 4, the broadcast spectrum is received at the antenna 102 and provided to a tuner 104. The tuner 104 may be a conventional 181 channel tuner such as is available from Sharp Electronics of Japan. Television channel selection is accomplished by BCD channel selection 101 and digital channel select control 103. However, rather than using the tuner in its normal configuration, the feedback for the automatic gain control is set to maximize the gain for optimum data signal to noise ratio between −15 to 55 dBM, which may, for example, be at 40 DBM. The IF output 106 of the tuner 104 is split by a conventional divider or duplexer (not shown) into two separate processing channels: a horizontal sync processing channel 120 and a data bandwidth processing channel 140.

The spectrum for the IF output 106 of the tuner 104 is as shown in FIG. 3. The IF 50 carrier for an NTSC format combined video data signal is preferably at 45.75 MHz. Adjacent to the carrier 50 is the entire video spectrum 51 including the vestigial video sideband. For NTSC, the video bandwidth starts at 41.65 MHz and continues to where the color subcarrier is located 52, i.e., about 3.58 MHz below the IF carrier. At that point, the data IF band width 54 is located, i.e., from about 3.6 MHz to 4.2 MHz below the IF carrier for NTSC video. Also present are the data subcarrier 56 shown here at the upper end of the data bandwidth (i.e., about 5.4 MHz below the carrier) and the audio spectrum 58 centered around an audio subcarrier not shown located at about 5.7 MHz below the IF carrier 50 for NTSC video.

In the data bandwidth processing channel 140, the IF video signal may be passed through an IF carrier notch filter 142, which using the above mentioned tuner for NTSC video is at 45.75 MHz. The output of the bandpass filter 142 is then amplified by two successive IF amplifiers 144, 146, forming the first stage of IF amplification. These amplifiers 144 and 146 have gains of 12 dB and 12 dB, respectively, bandwidths of 0.1 to 1 GHz and 16 Hz, respectively and have third order intercept points of 30 dBM each. These amplifiers may be monolithic integrated circuit amplifiers from Hewlett-Packard. The output of the IF amplifiers 144 and 146 is coupled to a surface acoustical wave (SAW) data bandpass filter 148. The data bandpass filter 148 has a bandpass for the data bandwidth in the IF signal. For example, for data injected into an NTSC color video signal where the IF carrier is at 45.75 MHz, the bandpass range should be about 41.82 MHz to 41.55 MHz. The slope of the filters at 270 KHz is −1 DB with a ripple of 0.1 dB and a delay of 400 nanoseconds.

The output of a first data bandpass filter 148 is coupled to two additional monolithic integrated circuit IF amplifiers 150, 152 forming a second stage of IF amplification. These amplifiers 150, 152 have gains of 12 dB and 12 dB, respectively, bandwidths of 0.1 to 1 GHz, respectively and have third order intercept points of 30 DBM dB and 30 DBM dB, respectively. These amplifiers may be monolithic integrated circuit amplifiers from Hewlett-Packard.

The output of the second stage of amplification by amplifiers 150, 152 is coupled to a second data bandpass SAW filter 154. This second filter has a passband that is the same as the first filter 148; i.e. 41.82 MHz to 41.55 MHz for an NTSC video signal using an IF carrier at 45.75 MHz. The output of the second data bandpass filter 154 is coupled to a third stage of amplification, comprising yet two more amplifiers 156, 158, having gains of 32 dB and 12 dB respectively, bandwidths of 0.1 to 1 GHz and 0.1 to 1 GHz respectively and third order intercept points of 27 dBM and 27 dBM, respectively.

The output of this last stage of amplification from amplifiers 156, 158 is coupled to a second mixer 160. This second mixer 160 may be a RFMX-1 available from R.F. Prime of Rancho Cordoua, Calif. The output of the second mixer 160 is coupled to a low pass filter 162 that is low pass filtered with a cutoff frequency of 5 MHz or some other frequency just above the upper limit of the baseband data bandwidth, such that zfc is at least 60 db down, to provide the baseband data signal. The output of the low pass filter 162 is amplified and buffered by amplifier 168 to provide band data to be decoded by a decoder such as a decoder disclosed in either of U.S. Pat. Nos. 5,327,237, col. 6, line 58 through col. 8, line 6; and U.S. Pat. No. 5,387,941, col. 11, line 14 through col. 13, line 1.

The horizontal sync channel 120 comprises a first video amplifier 122 followed by a standard Nyquist slope video SAW 124 that provides a standard IF video signal to a video demodulator 126, which may for example be a MC44301 from Motorola of Phoenix, Ariz. The video demodulator 126 provides two outputs: the baseband video 127 and a local oscillator signal 128 at one-half of the IF carrier frequency. The local oscillator signal 128 tracks frequency drift of the video carrier such that changes in frequency of the video carrier result in corresponding frequency changes of one-half the magnitude of the local oscillator signal 128. After frequency doubling by a frequency doubler 130, an IF carrier drift tracking signal 131 is provided. Thus, if the video carrier such as video carrier 22b -1 drifts 2 KHz, the output of the frequency doubler, the IF tracking signal 131, will substantially match that drift by changing 4 KHz. By tracking the transmitter carrier's frequency drift, the locally generated data subcarrier, shown in FIG. 4, more precisely locked to the transmitter's data subcarrier. Having this improved lock minimizes beat frequencies in the data.

The output 127 of the video demodulator 126 is filtered by a sound trap 134 and amplified by baseband amplifier 136 to provide a baseband video signal. Although the baseband video signal may include the entire picture information in the signal, all that is necessary is a sufficient portion of the video signal such that the sync detectors in the decoder such as those described in the above referenced patents (not shown) may decode the video information.

Figure 5:
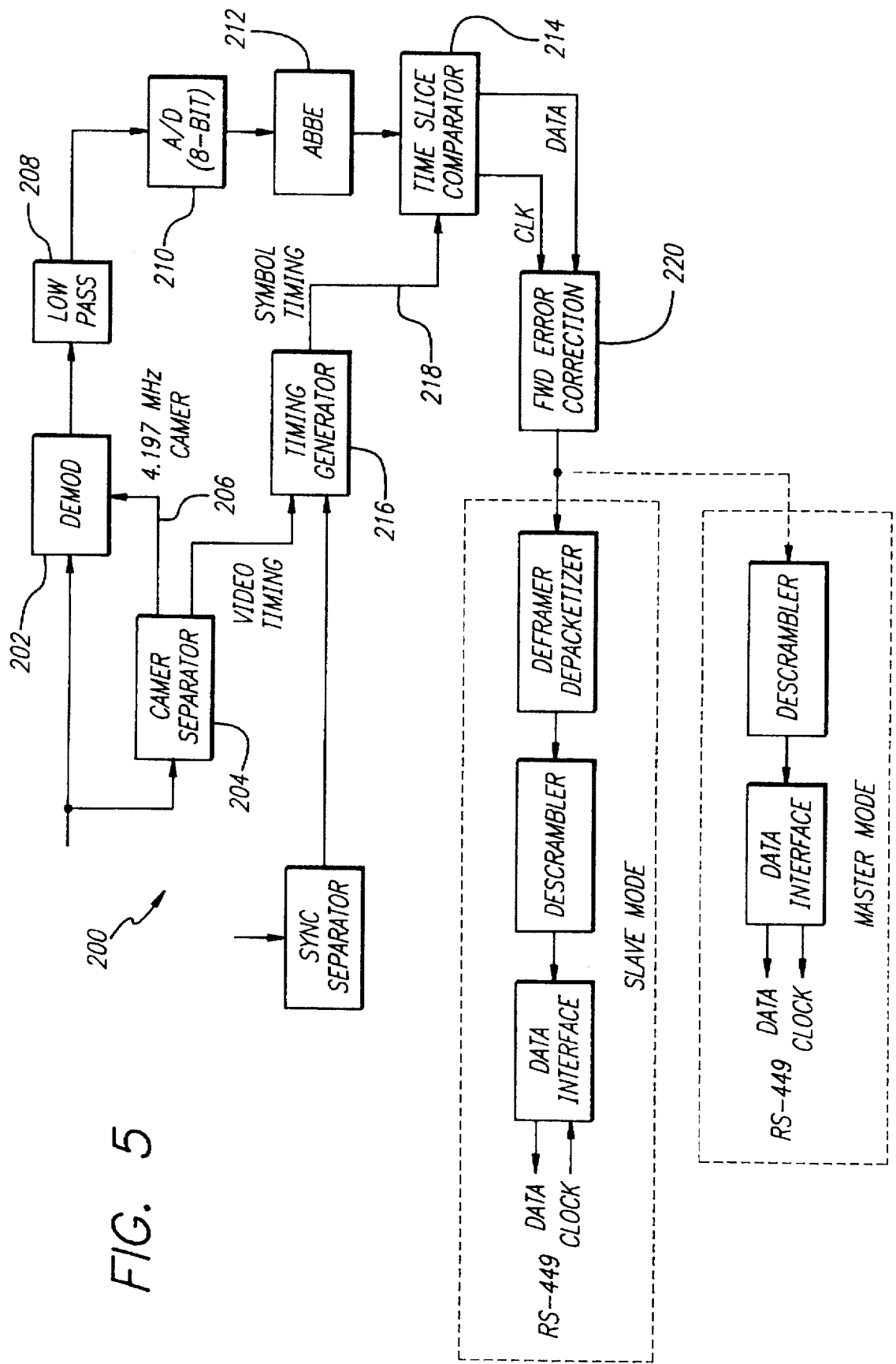
FIG. 5 is a block diagram of an additional decoder for use with the present invention.

FIG. 5 shows a block diagram of a digital embodiment of a decoder 200 that may be used with the processor of FIG. 4. In particular, the baseband data from the amplifier 171 is coupled to both the demodulator 202 and the carrier separator 204 that recovers the data subcarrier 206 in the manner described in U.S. Patent Nos. 5,387,941 and 5,410,360 for use by the demodulator 202. The output of the demodulator 202 is low pass filtered by a filter have an upper frequency limit of less than 1 MHz so that the data may be sampled by an analog to digital converter 210 for digital signal processing by over sampling the analog signal from the low pass filter 208. Preferably, the low pass filter band limits the signal to avoid aliasing noise by the A/D converter. The output of the converter is provided to an adaptive baseband equalizer 212 for removing to the extent possible, the noise and phase distortion induced by the communications channel. The output of the equalizer 212 is coupled to the timing slice comparator 214 which receives the symbol timing 218 from the timing generator 216 discussed below. The output of the time slice comparator provides the digital data and the clock information to the forward error correction decoder 220 for subsequent removal of any framing, descrambling and coupling to a data interface such as an IEEE RS 449 interface. The timing generator 216 uses the synch signal from the baseband amplifier 136 to control the timing of the decoder in the manner described in U.S. Pat. No. 5,410,360.

While specific embodiments are disclosed, it should be readily understood by those of skill in the field that the invention is far broader than the specific embodiments disclosed. For example, although the local oscillator 128 outputs a frequency that is one half of the IF carrier frequency, it will readily be understood that the particular submultiple was chosen as a matter of convenience due the availability of conventional parts. Other integer submultiples may be suitable such as ⅓, ¼, etc. and of course the frequency of the IF carrier may be used frequency. Similarly, the specific amplifiers chosen in the data bandwidth processing channel are commercially available parts so amplifiers having other associated parameters are possible. Also, although the use of two stages of filtering is done in the data bandwidth, one stage could be done, for example, with a filter having sharper slopes. While the specific design embodiments may vary, the object is to remove as much of the signal that is not part of the data bandwidth as is possible in the data channel bandwidth processor. Therefore, resort to the true scope of the invention should be had to the claims.

I claim:

1. An apparatus for frequency shifting at least a portion of a video signal, the video signal having been produced at a baseband and having been transmitted by modulation with a video carrier having a frequency subject to drift, the apparatus comprising:

a first demodulator responsive to the transmitted video signal to shift the video signal to an intermediate frequency bandwidth;

a second demodulator responsive to the video signal to produce an intermediate frequency carrier that tracks the drift of the video carrier;

a third demodulator responsive to the shifted video signal and the intermediate frequency carrier to provide at least the portion of the video signal at baseband.

2. The apparatus of claim 1, wherein the shifted video signal includes a data bandwidth transmitted with the video signal and the apparatus further includes:

a bandpass filter responsive to the output of the first demodulator, the bandpass filter having a pass band substantially equal to the data bandwidth.

3. The apparatus of claim 2, wherein the pass band of the filter is located between about 4.906 MHz to 5.176 MHz from the IF carrier frequency.

4. The apparatus of claim 2, wherein the data was injected into the video bandwidth with a data subcarrier, and the output of the third demodulator is coupled to a decoder, the decoder including:

means for detecting the data subcarrier; and means for demodulating the data from the output of the third demodulator.

5. An apparatus for eliminating intermodulation noise from a data signal having a bandwidth in the IF bandwidth for a received color vestigial sideband video signal having a bandwidth, a color subcarrier at a frequency within the bandwidth, and been transmitted in association with an IF carrier, the data bandwidth having been established by injection with a data subcarrier into the video signal between the upper frequency limit of the bandwidth and the subcarrier;

a first demodulator responsive to the received video signal and a locally generated carrier at a presumed frequency of the video signal to provide as an output a frequency shifted video signal;

a bandpass filter having upper and lower frequency limits a predetermined amount away from the IF carrier, the difference between the upper and lower frequency limits being substantially equal to the predetermined frequency difference of the upper limit of the video bandwidth and the lower frequency difference from the color subcarrier; and a second demodulator responsive to the output of the bandpass filter to frequency shift the output of the bandpass filter to a lower frequency.

6. The apparatus of claim 5, wherein the frequency of the video carrier has drift and the second demodulator is responsive to a local oscillator producing an IF carrier that tracks the drift of the video carrier.

7. The apparatus of claim 5, wherein the frequency shifted output of the bandpass filter is further processed by a decoder including:

a data subcarrier detector responsive to the video subcarrier to produce a reconstructed data subcarrier;

and a data demodulator responsive to the reconstructed data subcarrier to decode the signal.

8. The apparatus of claim 6, wherein the pass band of the filter is between about 4.906 MHz and 5.176 MHz from the frequency of the carrier.

9. A method for demodulating a data signal embedded in a portion of the bandwidth of a video signal, the video signal having been modulated with a carrier having a carrier frequency for transmission over a communications channel having a bandwidth, the method comprising:

shifting the video signal from the bandwidth to a second, intermediate bandwidth whereby the embedded portion of the bandwidth is shifted, the shifting being associated with a first frequency;

filtering the shifted video signal to eliminate substantially all of the shifted bandwidth other than the embedded portion of the bandwidth for the data signal to provide a filtered video signal;

shifting the filtered video signal a second time to a lower frequency.

10. The method of claim 9, wherein the filtering attenuates substantially all of the spectrum that is less than 4.85 MHz from the carrier frequency.

11. The method of claim 9, wherein the filtering attenuates substantially all of the spectrum that is more than 5.45 MHz from the carrier frequency.

12. A method for demodulating a data signal injected into a video signal that is subsequently shifted to a transmission bandwidth by modulating the signal with a carrier having frequency drifts that the shifted video signal may be received, the injection occurring by a subcarrier having a frequency and a phase, the method comprising:

shifting the received video signal to a different frequency range to provide an intermediate frequency video signal;

shifting the intermediate frequency video signal to baseband while tracking the frequency drift of the carrier;

generating a local data subcarrier having the exact same phase and frequency as the data subcarrier at the transmitter, whereby no beats are generated from the demodulation of the data signal with the locally generated data subcarrier.

* * * * *